United States Patent
Bono et al.

(10) Patent No.: US 11,444,118 B2
(45) Date of Patent: Sep. 13, 2022

(54) METHOD OF MANUFACTURING AN OPTOELECTRONIC DEVICE COMPRISING A PLURALITY OF DIODES

(71) Applicant: Commissariat à l'Énergie Atomique et aux Énergies Alternatives, Paris (FR)

(72) Inventors: Hubert Bono, Grenoble (FR); Julia Simon, Grenoble (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 88 days.

(21) Appl. No.: 16/568,392

(22) Filed: Sep. 12, 2019

(65) Prior Publication Data
US 2020/0091224 A1   Mar. 19, 2020

(30) Foreign Application Priority Data

Sep. 13, 2018 (FR) ..................... 1858201

(51) Int. Cl.
*H01L 21/26* (2006.01)
*H01L 21/336* (2006.01)
(Continued)

(52) U.S. Cl.
CPC .......... *H01L 27/153* (2013.01); *H01L 25/167* (2013.01); *H01L 27/1443* (2013.01);
(Continued)

(58) Field of Classification Search
CPC ....... H01L 51/0032–0095; H01L 27/32–3297; H01L 2251/50–568; H01L 33/0093;
(Continued)

(56) References Cited

U.S. PATENT DOCUMENTS

| 8,421,230 B2* | 4/2013 | Louis .................... H01L 23/481 257/758 |
| 9,768,345 B2* | 9/2017 | Hu ........................ H01L 33/405 |

(Continued)

FOREIGN PATENT DOCUMENTS

| EP | 2 329 536 A1 | 6/2011 |
| EP | 2 706 572 A2 | 3/2014 |

(Continued)

OTHER PUBLICATIONS

European Search Report for European Application No. 19196051, dated Dec. 27, 2019.
(Continued)

*Primary Examiner* — Mary A Wilczewski
*Assistant Examiner* — Tsz K Chiu
(74) *Attorney, Agent, or Firm* — Wolf, Greenfield & Sacks, P.C.

(57) ABSTRACT

A method of manufacturing an optoelectronic device, including: a) transferring, onto a connection surface of a control circuit, an active diode stack including at least first and second semiconductor layers of opposite conductivity types, so that the second semiconductor layer in the stack faces the connection surface of the control circuit and is separated from the connection surface of the control circuit by at least one insulating layer; b) forming in the active stack trenches delimiting a plurality of diodes, the trenches extending through the insulating layer and emerging onto the connection surface of the control circuit; and c) forming in the trenches metallizations connecting the second semiconductor layer to the connection surface of the control circuit.

11 Claims, 8 Drawing Sheets

(51) Int. Cl.
| | |
|---|---|
| *H01L 27/15* | (2006.01) |
| *H01L 25/16* | (2006.01) |
| *H01L 27/144* | (2006.01) |
| *H01L 31/0224* | (2006.01) |
| *H01L 31/18* | (2006.01) |
| *H01L 33/38* | (2010.01) |
| *H01L 33/58* | (2010.01) |
| *H01L 33/00* | (2010.01) |

(52) U.S. Cl.
CPC .. *H01L 31/022408* (2013.01); *H01L 31/1856* (2013.01); *H01L 33/0093* (2020.05); *H01L 33/382* (2013.01); *H01L 33/58* (2013.01)

(58) Field of Classification Search
CPC ....... H01L 33/62; H01L 33/22; H01L 33/382; B32B 2457/206
See application file for complete search history.

(56) References Cited

U.S. PATENT DOCUMENTS

| | | | | |
|---|---|---|---|---|
| 2002/0036055 A1* | 3/2002 | Yoshimura | .......... | H01L 21/6835 156/234 |
| 2007/0126056 A1* | 6/2007 | Hirler | ................ | H01L 29/7395 257/E29.066 |
| 2011/0156064 A1* | 6/2011 | Seo | .................... | H01L 25/0753 257/88 |
| 2011/0297972 A1* | 12/2011 | Seo | .................... | H01L 25/0753 257/88 |
| 2012/0043563 A1* | 2/2012 | Ibbetson | ............. | H01L 25/0753 257/88 |
| 2012/0168715 A1* | 7/2012 | Horng | .................. | H01L 27/153 257/13 |
| 2015/0108514 A1* | 4/2015 | Shi | ......... | H01L 33/385 257/88 |
| 2016/0064439 A1* | 3/2016 | Or-Bach | ........... | H01L 27/14623 257/443 |
| 2016/0276329 A1* | 9/2016 | Bono | ..................... | H01L 33/20 |
| 2016/0291428 A1* | 10/2016 | Itou | ................... | G02F 1/134363 |
| 2018/0204826 A1* | 7/2018 | Or-Bach | .......... | H01L 21/76254 |
| 2018/0331153 A1* | 11/2018 | Robin | .................. | H01L 27/124 |
| 2019/0288156 A1* | 9/2019 | Chaji | ................. | H01L 33/0037 |
| 2019/0305175 A1* | 10/2019 | Udrea | .................. | H01L 31/112 |
| 2020/0335484 A1* | 10/2020 | Bono | ..................... | H01L 33/62 |
| 2020/0343310 A1* | 10/2020 | Bae | ..................... | H01L 27/3272 |

FOREIGN PATENT DOCUMENTS

| | | |
|---|---|---|
| EP | 3 070 752 A1 | 9/2016 |
| WO | WO 2010/035211 A1 | 4/2010 |

OTHER PUBLICATIONS

FR18/58201, Apr. 25, 2019, Preliminary Search Report.
Preliminary Search Report for French Application No. 18/58201, dated Apr. 25, 2019.
Matsuo et al., Novel technology for hybrid integration of photonic and electronic circuits. IEEE Photonics Technology Letters. 1996;8(11):1507-9.
EP19196051, Dec. 27, 2019, European Search Report.

* cited by examiner

METHOD OF MANUFACTURING AN OPTOELECTRONIC DEVICE COMPRISING A PLURALITY OF DIODES

CROSS-REFERENCE TO RELATED APPLICATIONS

This application claims priority to French patent application number 18/58201, the content of which is hereby incorporated by reference in its entirety to the maximum extent allowable by law.

BACKGROUND

The present application relates to the field of optoelectronic devices. It more specifically relates to a method of manufacturing an optoelectronic device comprising a plurality of semiconductor diodes, for example, gallium nitride diodes, and an electronic circuit for controlling these diodes.

DISCUSSION OF THE RELATED ART

An emissive display device comprising an array of gallium nitride (GaN) light-emitting diodes (LEDs), and a control circuit enabling to individually control the LEDs to display images, have already been provided.

To form such a device, it may be provided to separately manufacture the control circuit and the LED array, and then to hybridize them, that is, to stack them by connecting them to each other.

A disadvantage of such a manufacturing method is the need to accurately align the control circuit and the LED array during the step of assembly of the two elements, so that each LED is effectively positioned on a metal pad corresponding thereto in the control circuit. Such an alignment is particularly difficult to achieve when the pitch between pixels decreases, and is an obstacle to an increase in the resolution and/or in the pixel integration density.

To overcome this disadvantage, it has been provided, particularly in international patent application N°WO2017194845 (DD16946/B15015) filed by the applicant on May 13, 2016, and in French patent application N°17/60578 (DD17951/B16061) filed by the applicant on Nov. 10, 2017, to:

first form the control circuit in the form of an integrated circuit comprising, on a surface, a plurality of metal pads intended to be connected to the LEDs to be able to individually control the current flowing through each LED;

then place on the surface of the control circuit comprising the metal pads an active LED stack continuously extending over the entire surface of the control circuit to connect a semiconductor layer of the stack to the metal pads of the control circuit; and then structure the active LED stack to delimit and insulate from one another the different LEDs of the device.

An advantage of such a manufacturing method is that, during the step of transferring the active LED stack onto the control circuit, the positions of the different LEDs of the device in the active stack are not defined yet. There is accordingly no strong alignment accuracy constraint during the transfer. The delimitation of the different LEDs in the active stack can then be performed by methods of substrate structuring and of deposition of insulating and conductive layers on a substrate, which provide an alignment accuracy much greater than the accuracy that can be obtained on transferring a substrate onto another.

It would however be desirable to at least partly improve certain aspects of the methods described in the above-mentioned International patent application N°WO2017194845 and French patent application N°17/60578.

In particular, in the methods described in the above-mentioned patent applications, during the step of transfer of the active LED stack onto the control circuit, the bonding of the active LED stack to the control circuit should be capable not only of mechanically bonding the active circuit to the control circuit, but also of electrically connecting the active stack to each of the metal pads of the control circuit. In practice, such a bonding is difficult to achieve.

In the above-mentioned patent applications, it has in particular been provided, before the transfer of the active LED stack onto the control circuit, to deposit a first metal layer on the connection surface of the control circuit, and to deposit a second metal layer on the surface of the stack intended to be placed into contact with the control circuit. The active LED stack is then bonded to the control circuit by molecular bonding or by direct bonding of the first metal layer to the second metal layer. In practice, it can however be observed that the bonding of the first metal layer (on the control circuit side) to the second metal layer (on the side of the active LED stack) is not always perfect. More particularly, there may exist, at the interface between the control circuit and the active LED stack, areas where the first and second metal layers are not in contact. If, in practice, such bonding defects raise no mechanical resistance issue, they may cause in fine electric connection defects between the control circuit and certain LEDs of the device. In particular, certain pixels may be made unusable due to a defect, or even to a lack of electric connection between the LED and the control circuit.

SUMMARY

Thus, an embodiment provides an optoelectronic device manufacturing method, comprising the steps of:

a) transferring, onto a connection surface of a control circuit, an active diode stack comprising at least first and second doped semiconductor layers of opposite conductivity types, so that the second semiconductor layer in the stack faces the connection surface of the control circuit and is separated from the connection surface of the control circuit by at least one electrically-insulating layer;

b) forming in the active stack trenches delimiting a plurality of diodes, the trenches further extending through said at least one insulating layer and emerging onto the connection surface of the control circuit; and c) forming in the trenches first metallizations connecting the second semiconductor layer of the stack to the connection surface of the control circuit.

According to an embodiment, the method further comprises forming, in the trenches, second metallizations insulated from the first metallizations, in contact with the sides of the first semiconductor layer.

According to an embodiment, the method comprises, successively:

a first step of partial forming of the trenches all the way to an intermediate level of the first semiconductor layer;

a step of deposition of a first metal layer on the lateral walls of the trenches;

a step of forming of first spacers made of an insulating material on the lateral walls of the trenches;

a step of extension of the trenches all the way to an intermediate level of second semiconductor layer;

a step of forming second spacers made of an insulating material on the lateral walls of the trenches;

a step of extension of the trenches all the way to the connection surface of the control circuit; and a step of deposition of a second metal layer on the lateral walls of the trenches, the first metallizations being formed in the second metal layer and the second metallizations being formed in the first metal layer.

According to an embodiment, the method further comprises, before step a):

a step of deposition of a first insulating layer over the entire surface of the connection surface of the control circuit; and a step of deposition of a second insulating layer over the entire surface of the second semiconductor layer of the active diode stack, the active diode stack being bonded to the control circuit by direct bonding of the first layer to the second layer, said at least one insulating layer being formed by the stack of the first and second insulating layers.

According to an embodiment, the first and second insulating layers are made of silicon oxide.

According to an embodiment, at step a), the active diode stack is bonded to the control circuit by means of a layer made of an electrically insulating bonding material, forming said at least one insulating layer.

According to an embodiment, the electrically insulating bonding material is an organic glue.

According to an embodiment, the method further comprises, before step a), a step of deposition of a metal layer on top of and in contact with the entire surface of the second semiconductor layer of the active stack.

According to an embodiment, during the implementation of step a), the active stack is supported by a support substrate located on the side of the first semiconductor layer opposite to the second semiconductor layer, the method further comprising, between step a) and step b), a step of removing the support substrate.

According to an embodiment, the semiconductor diodes are light-emitting diodes.

According to an embodiment, the diodes are photodiodes.

According to an embodiment, the first and second semiconductor layers are gallium nitride layers, the diodes being gallium nitride diodes.

According to an embodiment, the control circuit is formed inside and on top of a semiconductor substrate.

Another embodiment provides an optoelectronic device comprising:

an integrated control circuit comprising a connection surface;

on the control circuit, an active diode stack comprising at least first and second doped semiconductor layers of opposite conductivity types, the second layer being separated from the connection surface of the control circuit by at least one insulating layer;

trenches extending in the active stack and delimiting in the active stack a plurality of diodes; and in the trenches, first metallizations connecting the second semiconductor aver of the stack to the connection surface of the control circuit.

According to an embodiment, the device further comprises, in the trenches, second metallizations insulated from the first metallizations, in contact with the sides of the first semiconductor layer.

The foregoing and other features and advantages will be discussed in detail in the following non-limiting description of specific embodiments in connection with the accompanying drawings.

DETAILED DESCRIPTION

The same elements have been designated with the same reference numerals in the various drawings and, further, the various drawings are not to scale. For clarity, only those steps and elements which are useful to the understanding of the described embodiments have been shown and are detailed. In particular, the forming of an integrated semiconductor diode control circuit has not been detailed, the described embodiments being compatible with usual structures and methods of manufacturing such control circuits. Further, the composition and the layout of the different layers of an active semiconductor diode stack have not been detailed, the described embodiments being compatible with usual active stacks of semiconductor diodes, particularly gallium nitride diodes. In the following description, unless otherwise specified, when reference is made to terms qualifying absolute positions, such as terms "front", "rear", "top" "bottom", "left", "right", etc., or relative positions, such as terms "above", "under", "upper", "lower", etc., or to terms qualifying directions, such as terms "horizontal", "vertical", "lateral", etc., it is referred to the orientation of the corresponding drawings, it being understood that, in practice, the described devices and assemblies may be oriented differently. The terms "approximately", "substantially", and "in the order of" are used herein to designate a tolerance of plus or minus 10%, preferably of plus or minus 5%, of the value in question.

Figure 1A:
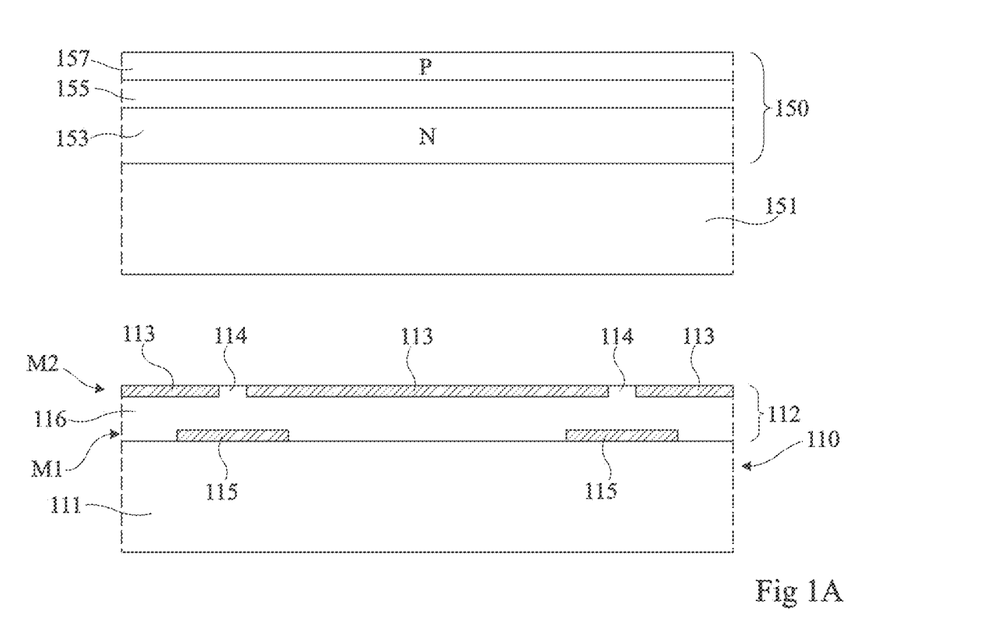
FIGS. 1A, 1B, IC, ID, 1E, 1F, 1G, 1H, 1I, 1J, 1K, IL, 1M, 1N, and 1O are cross-section views illustrating steps of an embodiment of an optoelectronic device manufacturing method.
Figure 1B:
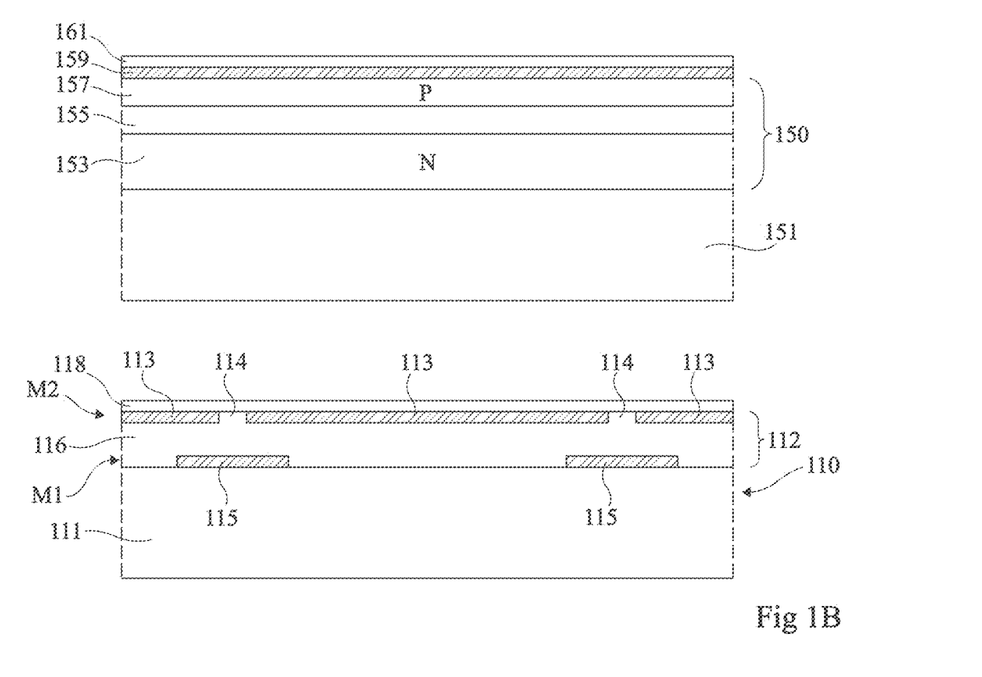

FIGS. 1A, 1B, IC, 1D, 1E, 1F, 1G, 1H, 1I, 1J, 1K, 1L, 1M, 1N, and 1O are cross-section views illustrating successive steps of an embodiment of an optoelectronic device manufacturing method.

FIG. 1A schematically shows an integrated control circuit 110, previously formed inside and on top of a semiconductor substrate 111, for example, a silicon substrate. In this example, control circuit 110 comprises, on its upper surface side, an interconnection stack 112 comprising, for each of the LEDs of the device, a metal connection pad 113 intended to be connected to one of the electrodes (anode or cathode) of the LED, to be able to control a current flowing through the LED and/or to apply a voltage across the LED. The control circuit further comprises, for each LED, connected to the metal pad 113 dedicated to the LED, an elementary control cell (not detailed) comprising one or a plurality of transistors, enabling to control the current flowing through the LED and/or a voltage applied across the LED. Control circuit 110 is for example made in CMOS technology. Metal pads 113 may be laterally surrounded with an insulating material 114, for example, silicon oxide, so that control circuit 110 has a substantially planar upper surface (or connection surface) comprising an array of metal regions 113 separated by insulating regions 114 (insulating regions 114 forming a continuous grid separating the rows and the columns of the array). As an example, each metal pad 113 has a width in the range from 0.5 to 200 µm and the width of insulating region 114 between two neighboring metal pads 113 is in the range from 0.5 to 20 µm. In the shown example, interconnection stack 112 further comprises, for each LED, a metal connection region 115 intended to be connected to the other electrode (cathode or anode) of the LED. In this example, connection regions 115 are formed in a metal level M1, and metal pads 113 are formed in a metal level M2 higher than level M1, separated from level M1 by an insulating layer 116, for example, made of silicon oxide. Connection regions 115 are at least partly arranged opposite insulating regions 114 laterally separating pads 113. As an example, connection regions 115 are interconnected to form a continuous metal grid common to all the pixels of the device, at least partly arranged opposite the insulating grid formed by regions 114.

FIG. 1A further schematically shows an active LED stack 150, arranged on the upper surface of a support substrate 151. Stack 150 is for example a gallium nitride LED stack. Support substrate 151 is for example a substrate made of silicon, of sapphire, of corundum, or of any other material onto which an active gallium nitride LED stack can be deposited. In the shown example, the active stack comprises, in the following order from the upper surface of substrate 151, an N-type doped gallium nitride layer 153, an emissive layer 155, and a P-type doped gallium nitride layer 157. Emissive layer 155 is for example formed of a stack of one or a plurality of emissive layers each forming a quantum well, for example, containing GaN, InN, InGaN, AlGaN, AlN, AlInGaN, GaP, AlGaP, AlInGaP, or a combination of one or a plurality of these materials. As a variation, emissive layer 155 may be an intrinsic, that is, non-intentionally doped, gallium nitride layer, for example having a residual donor concentration in the range from $10^{15}$ to $10^{18}$ atoms/cm$^3$, for example, in the order of $10^{17}$ atoms/cm$^3$. In the present example, the lower surface of emissive layer 155 is in contact with the upper surface of layer 153, and the upper surface of emissive layer 155 is in contact with the lower surface of layer 157. In practice, according to the nature of substrate 151, a stack of one or a plurality of buffer layers (not shown) may form an interface between support substrate 151 and gallium nitride layer 153. As an example, in the case of a silicon substrate 151, an aluminum nitride buffer layer may form an interface between substrate 151 and gallium nitride layer 153. Active stack 150 is for example deposited by epitaxy on support substrate 151. As an example, the thickness of layer 153 is in the range from 0.2 to 2 µm, for example, in the order of 1 µm. As an example, the thickness of layer 155 is in the range from 30 to 300 nm, for example, in the order of 100 nm. As an example, the thickness of layer 157 is in the range from 5 to 300 nm, for example, in the order of 100 nm.

FIG. 1B illustrates a step of deposition, on the upper surface of control circuit 110, of a layer 118 made of an electrically-insulating material, for example, of silicon oxide. In the shown example, insulating layer 118 substantially coats the entire upper surface of control circuit 110. In particular, insulating layer 118 is in contact with metal connection pads 113 of control circuit 110 and with the insulating regions 114 laterally separating pads 113. The deposition of insulating layer 118 may be followed by a step of planarization of the upper surface of layer 118, for example, by chemical-mechanical polishing (CMP), to obtain a layer 118 having a low surface roughness, for example, a surface roughness smaller than 2 nm and preferably smaller than 1 nm. The thickness of insulating layer 118 (possibly after planarization) is for example in the range from 20 nm to 1 µm.

FIG. 1B further illustrates a step of depositing, on the upper surface of active gallium nitride diode stack 150, a metal layer 159. In the shown example, metal layer 159 is deposited on top of and in contact with the upper surface of gallium nitride layer 157. Metal layer 159 for example coats substantially the entire upper surface of the active stack. Metal layer 159 is for example deposited by physical vapor deposition (PVD), by vacuum sputtering, or by chemical vapor deposition (CVD). Metal 159 particularly has a function of recovery of an electric contact on semiconductor layer 157 of the LED stack. Metal layer 159 may further have an optical reflector function. As an example, metal layer 159 is made of aluminum or of silver. The thickness of oxide layer 159 is for example in the range from 50 nm to 1 µm.

FIG. 1B further illustrates a step of deposition, on the upper surface of metal layer 159, of a layer 161 made of an electrically insulating material, for example, of the same material as layer 118, for example, of silicon oxide. In the shown example, insulating layer 161 is deposited on top of and in contact with the upper surface of metal layer 159. Insulating layer 161 for example coats substantially the entire upper surface of the active stack. The deposition of insulating layer 161 may be followed by a step of planarization of the upper surface of layer 161, for example, by chemical-mechanical polishing (CMP), to obtain a layer 161 having a low surface roughness, for example, a surface roughness smaller than 2 nm and preferably smaller than 1 nm. The thickness of insulating layer 161 (possibly after planarization) is for example in the range from 20 nm to 1 µm.

Figure 1C:
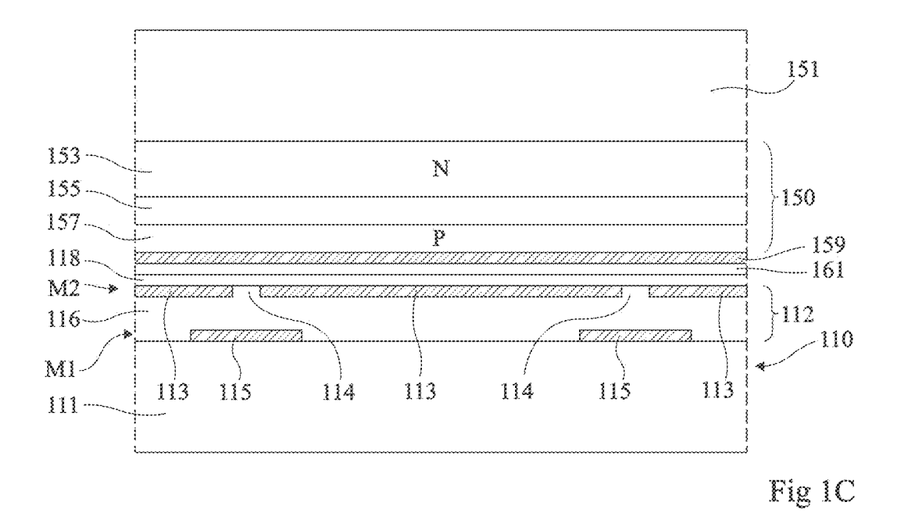

FIG. 1C illustrates a step during which active gallium nitride LED stack 150 is placed on the upper surface of control circuit 110. To achieve this, the assembly comprising support substrate 151 and active stack 150 may be flipped, and then placed on control circuit 110, to place the upper surface (in the orientation of FIG. 1B) of insulating layer 161 into contact with the upper surface of insulating layer 118. During this step, active stack 150 is bonded to control circuit 110 via insulating layers 161 and 118. As an example, the bonding of active stack 150 to control circuit 110 is performed by direct bonding (without addition of an additional bonding material), for example, by molecular bonding, between the upper surface of insulating layer 118 and the lower surface (in the orientation of FIG. 1C) of insulating layer 161. As a variation, the bonding of the two surfaces may be performed by thermocompression, or by any other adapted bonding method.

In this example, at the end of the step of transfer and of bonding of the active LED stack onto control circuit 110, the active LED stack is not electrically connected to control circuit 110. In particular, lower semiconductor layer 157 of the LED stack is electrically insulated from metal pads 113 of control circuit 110 by insulating layers 161 and 118.

Figure 1D:
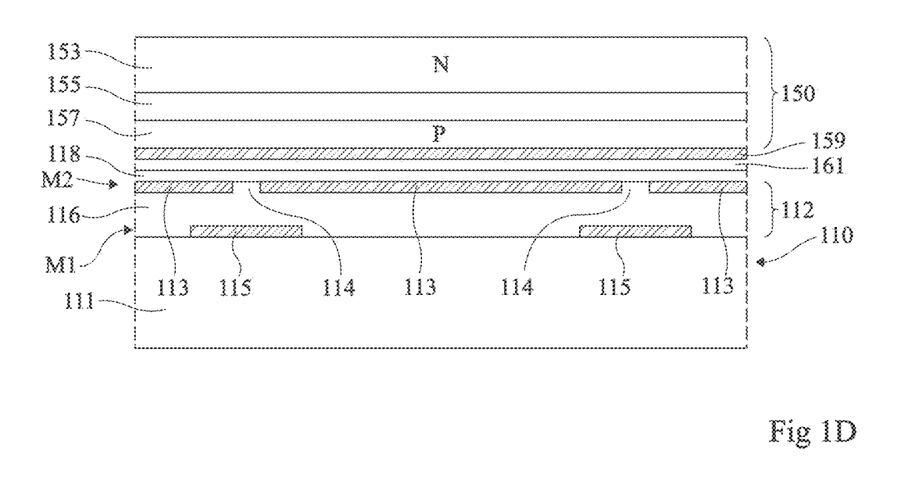

FIG. 1D illustrates a subsequent step of removal of support substrate 151 from active LED stack 150. Substrate 151 is for example removed by grinding and/or etching from its surface opposite to active stack 150. As a variation, in the case of a transparent substrate 151, for example, a sapphire or corundum substrate, substrate 151 may be separated from active stack 150 by means of a laser beam projected through substrate 151 from its surface opposite to active stack 150 (lift-off laser method).

More generally, any other method enabling to remove substrate 151 may be used.

After the removal of substrate 151, an additional etch step may be provided to remove possible buffer layers remaining on the upper surface side of gallium nitride layer 153. Further, a portion of the thickness of gallium nitride layer 153 may be removed, for example, by etching. At the end of this step, active stack 150 coats substantially the entire surface of control circuit 110, with no discontinuity. As an example, the thickness of active stack 150 after the removal of support substrate 151 is in the range from 0.2 to 10 µM.

Figure 1E:
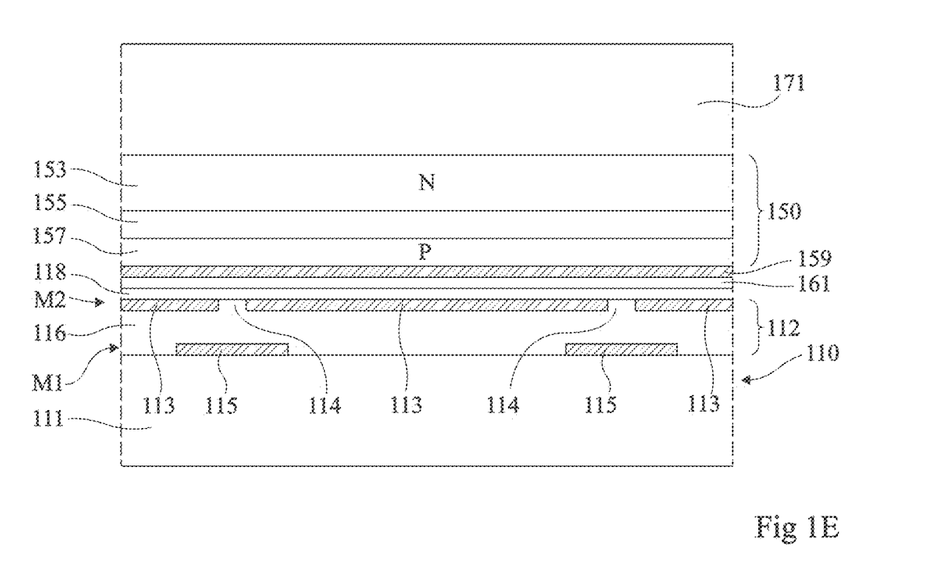

FIG. 1E illustrates a step, subsequent to the removal of substrate 151, of deposition of a hard mask 171 on the upper surface of active LED 150. Hard mask 171 is for example made of silicon or of silicon nitride. As a variation, hard mask 171 is formed of a stack (not detailed in the drawing) comprising, in the following order from the upper surface of N-type gallium nitride layer 153, a first silicon oxide, an intermediate etch step layer, for example, of silicon nitride or of titanium nitride, and a second silicon oxide layer.

Figure 1F:
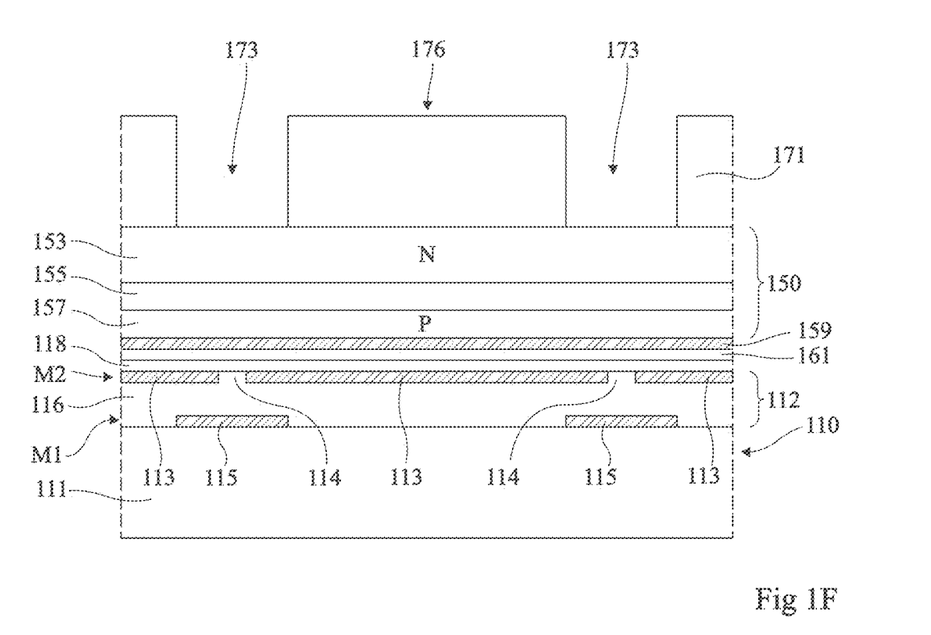

FIG. 1F illustrates a step of forming through openings or trenches 173 in hard mask 171, for example, by photolithography and then etching. Trenches 173 extend from the upper surface of hard mask 171 and emerge onto the upper surface of active LED stack 150. Trenches 173 delimit, in top view, the future individual LEDs 176 of the display device. Trenches 173 may be aligned with respect to reference marks previously formed on control circuit 110. AS an example, after the deposition of hard mask 171 but before the forming of trenches 173, reference marks previously formed on substrate 111 may be exposed by etching of hard mask 171 and of active stack 150 in peripheral areas of the assembly, the reference marks being then used as alignment marks for the positioning of the photolithography mask used to form trenches 173. In the shown example, each LED 176 is located, in vertical projection, opposite a single metal pad 113 of control circuit 110. More particularly, in the shown example, trenches 173 are aligned on insulating regions 114 of the upper surface of control circuit 110. In other words, in top view, the central longitudinal axes of trenches 173 and the central longitudinal axes of regions 114 are confounded. In this example, trenches 173 have a width greater than that of insulating regions 114. In other words, each trench 173 is located opposite not only an insulating strip 114 separating two neighboring rows or columns of metal pads 113, but also opposite a peripheral portion of metal pads 113 located on either side of strip 114.

Figure 1G:
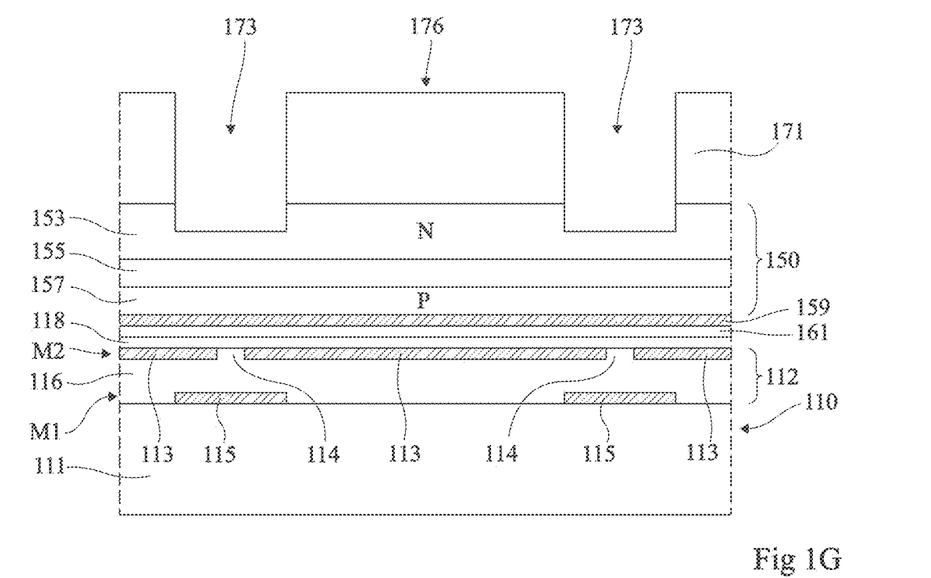

FIG. 1G illustrates a step of extension of trenches 173 into an upper portion of gallium nitride layer 153 of active LED stack 150. In this example, during this step, trenches 173 are vertically continued by etching all the way to an intermediate layer of layer 153, that is, to partially penetrate into layer 153, without fully crossing it.

Figure 1H:
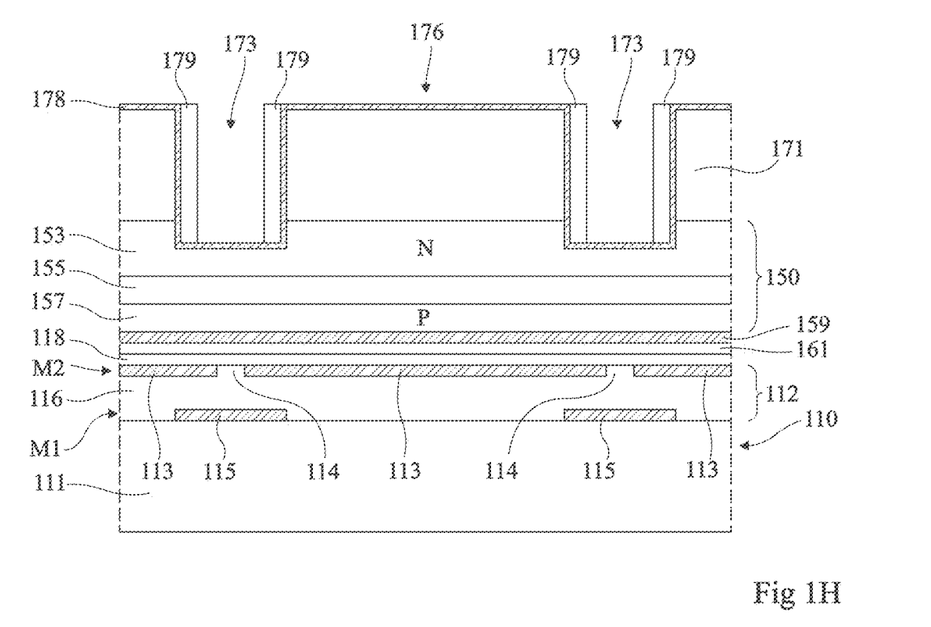

FIG. 1H illustrates a subsequent step of deposition of a conductive layer 178, for example, made of metal, for example, of aluminum or of titanium, on the lateral walls and on the bottom of trenches 173. In the shown example, layer 178 is further deposited on the upper surface of the portions of hard mask 171 topping LEDs 176. Layer 178 is for example deposited over the entire upper surface of the device by a conformal deposition method, for example, by a vacuum deposition method, for example, by physical vapor deposition, by sputtering, or by chemical vapor deposition. Metal layer 178 particularly has the function of taking an electric contact on semiconductor layer 153 of the LED stack. It should in particular be noted that in each LED 176 of the device, metal layer 178 is in contact with semiconductor layer 153 over the entire periphery of the LED, at the level of the lateral walls of a lower portion of trenches 173.

FIG. 1H further illustrates a step subsequent to the deposition of metal layer 178, during which spacers 179 made of an insulating material, for example, of silicon oxide or of nitride, are formed on the lateral walls of trenches 173. As an example, a layer of an insulating material is first deposited over the entire upper surface of the device, that is, on the lateral walls and on the bottom of trenches 173, as well as on the upper surface of the portions of hard mask 171 topping LEDs 176. As an example, the insulating layer is deposited on top of and in contact with the upper surface of metal layer 178, over the entire surface of the device. The insulating layer may be deposited by any adapted conformal deposition method. As an example, the thickness of the insulating layer is in the range from 50 nm to 1 µm. A step of vertical anisotropic etching of the insulating layer is then implemented to remove the horizontal portions of the insulating layer, at the bottom of trenches 173 and on the upper surface of the portions of hard mask 171 topping LEDs 176, and to keep the insulating layer only on the lateral walls of trenches 173 to form spacers 179.

Figure 1I:
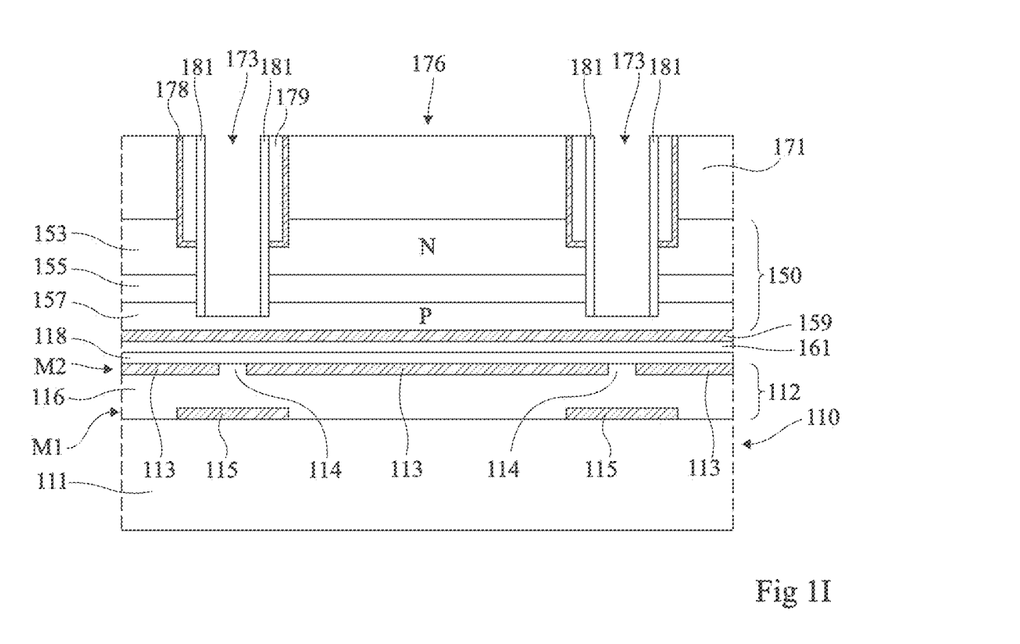

FIG. 1I illustrates a step subsequent to the forming of spacers 179, during which trenches 173 are extended, by etching, all the way to an intermediate level of lower semiconductor layer 157 of active LED stack 150. During this step, the etch method is selected to etch the metal of layer 178 and the materials of layers 153, 155, and 157 selectively over the material of spacers 179. Thus, the portions of metal layer 178 located at the bottom of trenches 173 and which are not topped with spacers 179, and the portions of metal layer 178 located on the portions of hard mask 171 topping LEDs 176 are removed during this step. In other words, only the portions of metal layer 178 coated with spacers 179 are kept during this step.

FIG. 1I further illustrates a step subsequent to the extension of trenches 173, during which spacers 181 of an insulating material, for example, silicon oxide or nitride, are formed again on the lateral walls of trenches 173. Similarly to what has been previously described in relation with FIG. 1H, a layer of an insulating material is first deposited over the entire upper surface of the device, by a conformal deposition method. As an example, the thickness of the insulating layer is in the range from 50 nm to 1 µm. A step of vertical anisotropic etching of the insulating layer is then implemented to keep the insulating layer only on the lateral walls of the trenches to form spacers 181.

Figure 1J:
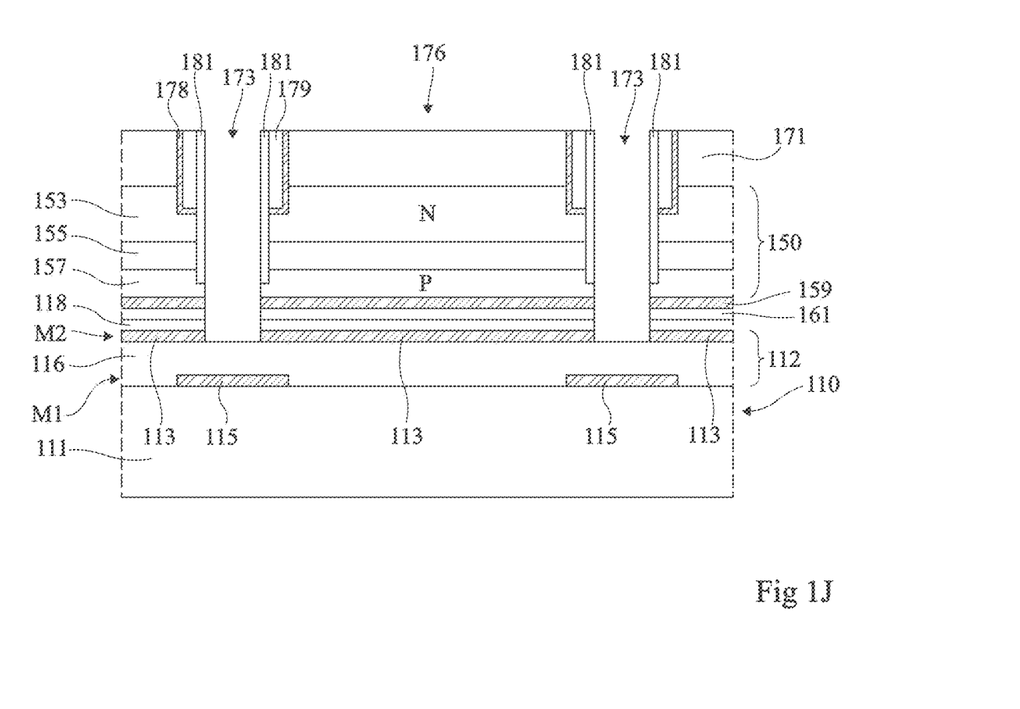

FIG. 1J illustrates a step subsequent to the forming of spacers 181, during which trenches 173 are extended, by etching, all the way to the upper surface of insulating layer 116 separating metallization levels M1 and M2 from control circuit 110. More particularly, during this step, one etches, at the bottom of trenches 173, the remaining lower portion of semiconductor layer 157, conductive layer 159, insulating layers 161 and 118, as well as insulating regions 114 and the peripheral portion of metal pads 113 opposite trenches 173. The etching is interrupted on the upper surface of insulating layer 116 separating metal levels M1 and M2 of control circuit 110, or in insulating layer 116.

The extension of trenches 173 results in delimiting in active stack 150 the different LEDs 176 of the device. Each LED 176 corresponds to an island or mesa formed in stack 150 and laterally surrounded with a trench 173. Thus, each LED 176 comprises a vertical stack comprising, in the order from the upper surface of metal layer 159, a portion of gallium nitride layer 157, corresponding to the anode of the LED in this example, a portion of emissive layer 155, and a portion of gallium nitride layer 153, corresponding to the cathode of the LED in this example.

Figure 1K:
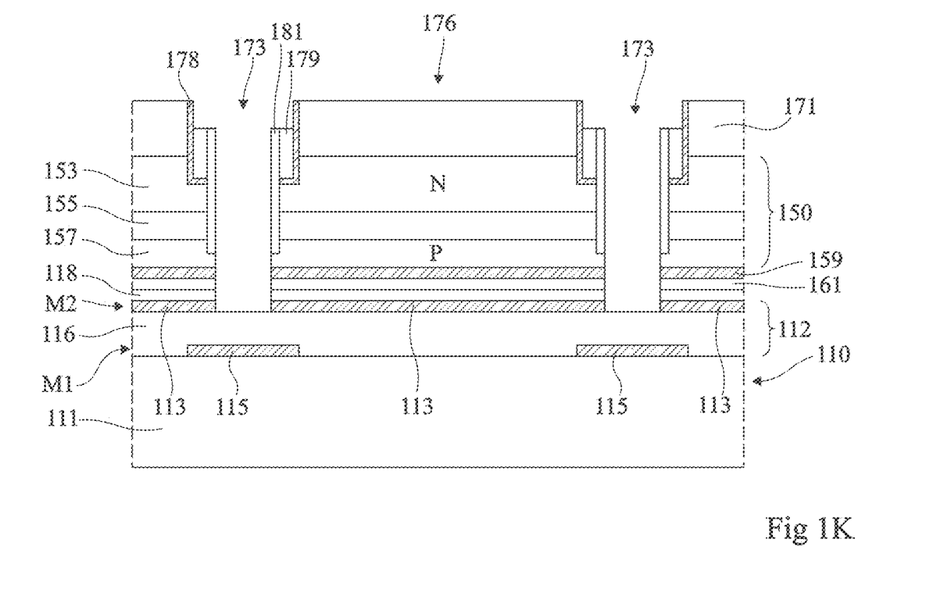

FIG. 1K illustrates a subsequent step of etching an upper portion of spacers 179 and 181, for example, by vertical isotropic etching. In this example, spacers 179 and 181 are etched on an upper portion of the sides of hard mask 171, but are kept intact on the lower portion of the sides of hard mask 171 as well as on the sides of underlying layers 153, 155, and 157 of LED stack 150. As an example, hard mask 171 comprises an intermediate etch stop layer, not detailed in the drawing, enabling to etch the spacers faster than hard mask 171, so that, at the end of the etch step, the upper surface of spacers 179 and 181 is recessed from the upper surface of hard mask 171.

Figure 1L:
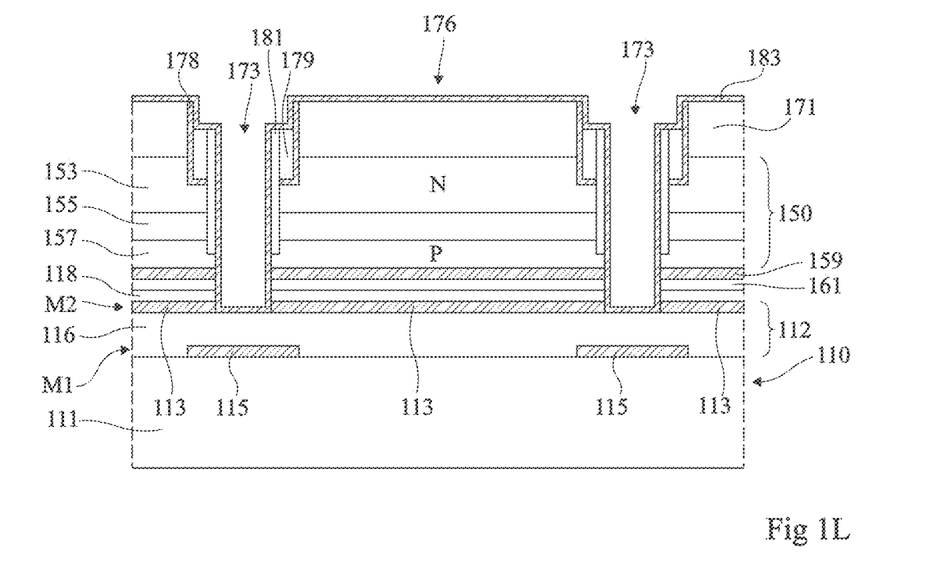

FIG. 1L illustrates a subsequent step of deposition of a metal layer 183 on the lateral walls and on the bottom of trenches 173. In the shown example, layer 183 is further deposited on the upper surface of the portions of hard mask 171 topping LEDs 176. Layer 183 is for example deposited over the entire upper surface of the structure obtained at the end of the steps of FIG. 1A a 1K, by a conformal deposition method, for example, by a vacuum deposition method, for example, by physical vapor deposition, by sputtering, or by chemical vapor deposition. Metal layer 183 particularly has the function, for each LED 176 of the device, of electrically connecting the anode contact metal layer 159 of the LED to the corresponding metal connection pad 113 of control circuit 110. However, at this stage, metal layer 183 further connects, in each LED 176, the anode contact metal layer 159 of the LED to the cathode contact metallization 178 of the LED. Further, layer 183 interconnects the anode contact regions 159 of the different LEDs 176 of the device.

Figure 1M:
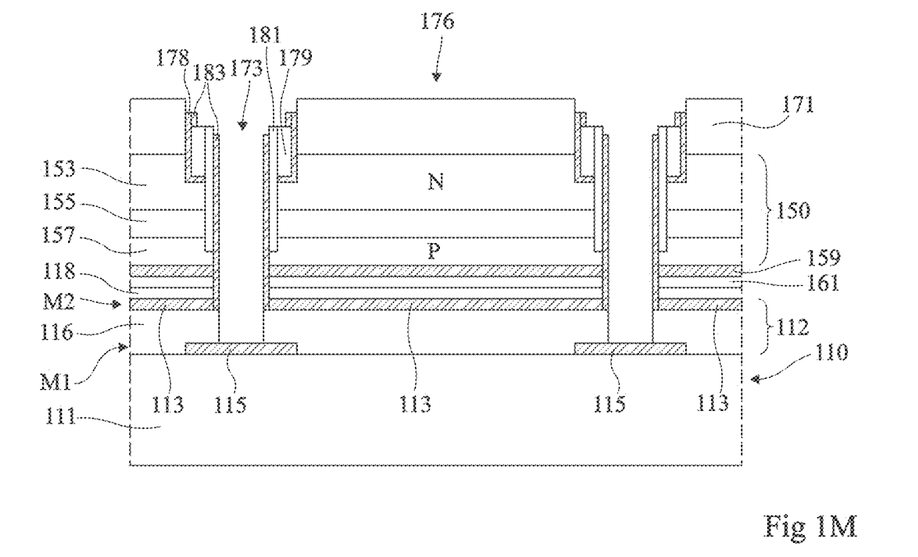

FIG. 1M illustrates a subsequent step of extension of trenches 173 all the way to the upper surface of the metal connection region 115 formed in metal layer M1 of control circuit 110. During this step, the horizontal portions of metal layer 183 located at the bottom of trenches 173 are removed, which results in insulating from one another the anode contact regions 159 of the different LEDs 176 of the device. Further, during this step, the horizontal portions of metal layer 183 coating the upper surface of spacers 179 and 181 are removed, which results in electrically insulating, in each LED 176, the anode contact metallization 159 of the LED of the cathode contact metallization 178 of the LED.

Figure 1N:
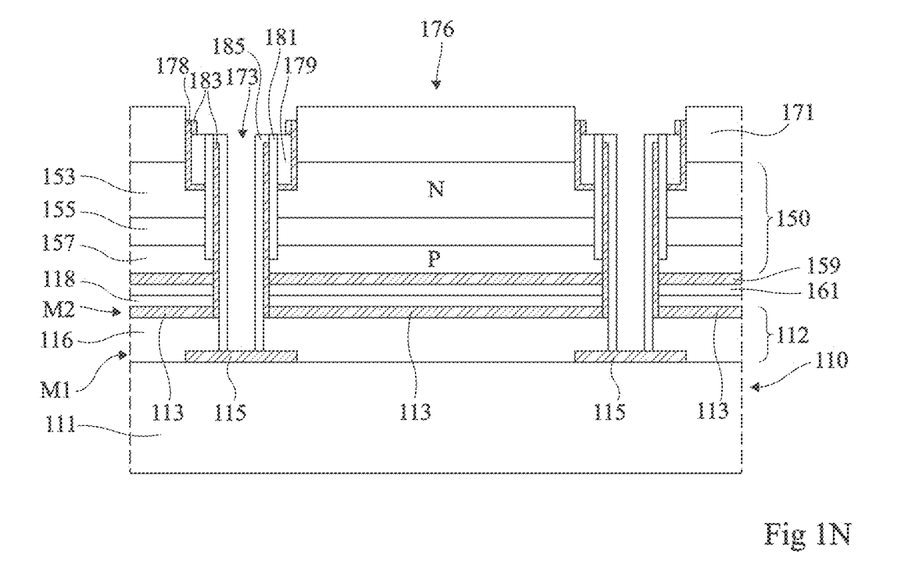

FIG. 1N illustrates a step subsequent to the extension of trenches 173, during which spacers 185 of an insulating material, for example, silicon oxide or nitride, are formed again on the lateral walls of trenches 173. Similarly to what has been previously described in relation with FIGS. 1H and 1I, a layer of an insulating material is first deposited over the entire upper surface of the device, by a conformal deposition method. As an example, the thickness of the insulating layer is in the range from 50 nm to 1 µm. A step of vertical anisotropic etching of the insulating layer is then implemented to keep the insulating layer only on the lateral walls of the trenches to form spacers 185. In this example, the thickness of the insulating layer and the conditions of the step of vertical anisotropic etching of the insulating layer are provided so that, at the end of the etch step, the upper surface of spacers 185 is located at an intermediate level between the plane of the upper surface of the portions of metal layer 183 in contact with anode contact metallizations 159 and with metal connection pads 113, and the plane of the upper surface of cathode contact metallizations 178. Thus, for each LED 176 of the display device, peripheral spacers 185 entirely covers the portion of metal layer 183 connecting the anode contact metallization 159 of the LED to the corresponding metal connection pad 113 of the control circuit, but leaves access to the cathode contact metallization 178 of the LED.

Figure 1O:
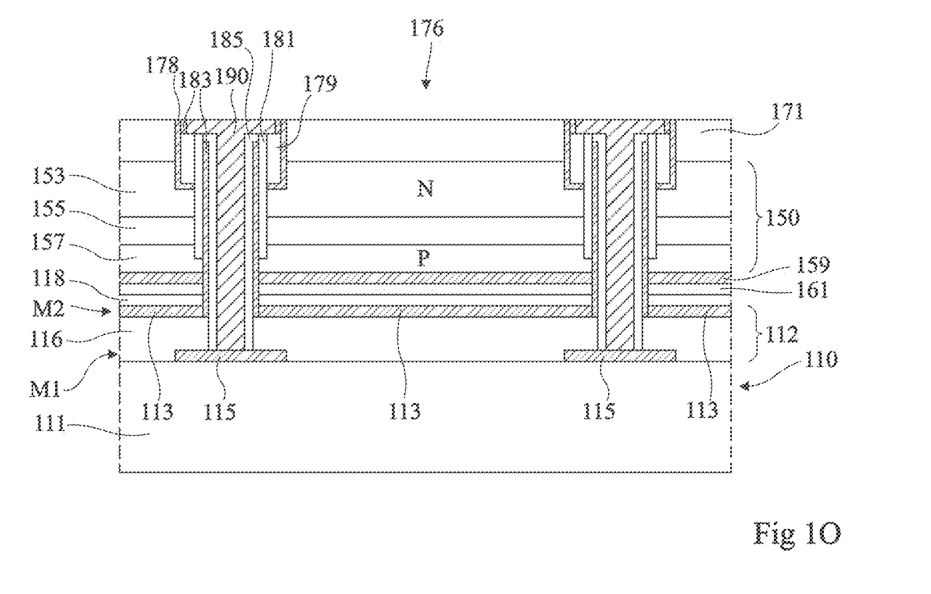

FIG. 1O illustrates a subsequent step of deposition of a metallization 190 on the lateral walls and on the bottom of trenches 173. In the shown example, metallization 190 entirely fills trenches 173. As an example, metallization 190 is formed by a damascene-type method, comprising a step of depositing a metal layer over the entire upper surface of the assembly across a thickness sufficient to fill trenches 173, followed by a step of chem.-mech. polishing of the upper surface of the assembly to planarize the upper surface of the device and remove the portions of the metal layer topping LEDs 176. All or part of the thickness of hard mask 171 may be removed during this step. In the shown example, a portion of the thickness of the hard mask is kept and is used as a layer of passivation of the upper surface of the cathode regions 153 of LEDs 176. Metallization 190 is for example made of a lower bonding layer, for example comprising an aluminum/titanium/titanium nitride/copper stack having a thickness in the range from 10 to 100 nm, for example, a thickness in the order of 50 nm, and of an upper filling layer, for example, made of copper, deposited by electrochemical deposition. Metallization 190 connects the cathode contact metallizations 178 of the different LEDs 176 of the device to one another as well as to the metal connection regions 115 of control circuit 110. Metallization 190 is however insulated by spacers 185 from the portion of metal layer 183 connecting, in each pixel, the anode contact metallization 159 of LED 176 to the corresponding connection pad 113 of the control circuit. In top view, metallization 190 has the shape of a continuous grid laterally surrounding and separating from one another the different pixels of the device.

An advantage of the method described in relation with FIGS. 1A to 1O is that the bonding of the active LED stack to the control circuit (FIG. 1C) is an insulator-to-insulator bonding, which is generally easier to form and has a better homogeneity than metal-to-metal bondings.

Further, in the method described in relation with FIGS. 1A to 1O, the bonding interface has no electric function. In other words, even if a local bonding defect occurred on bonding of the active LED stack to the control circuit, there would result no electric connection defect between control circuit 110 and the corresponding LED(s) 176 of the display device, since the electric connections between LEDs 176 and control circuit 110 are performed subsequently to the bonding.

Another advantage of the method described in relation with FIGS. 1A to 1O is that it has a single photolithography and etch step (to define the location of trenches 173), which makes it particularly simple and inexpensive to implement.

Another advantage of this method is that the electric cathode contact of LEDs 176 is taken laterally along the entire periphery of the cathode regions 153 of the LEDs. This enables to minimize the cathode contact resistance, and thus to limit the electric power consumption of the device.

Further, the arrangement of cathode contact metallizations 190 in the trenches for insulating LEDs 176 enables to maximize the active surface area of the display device. Such a layout further enables to reinforce the optical insulation between the different LEDs 176, and to favor the dissipation of the heat generated by LEDs 176 in operation.

Figure 2:
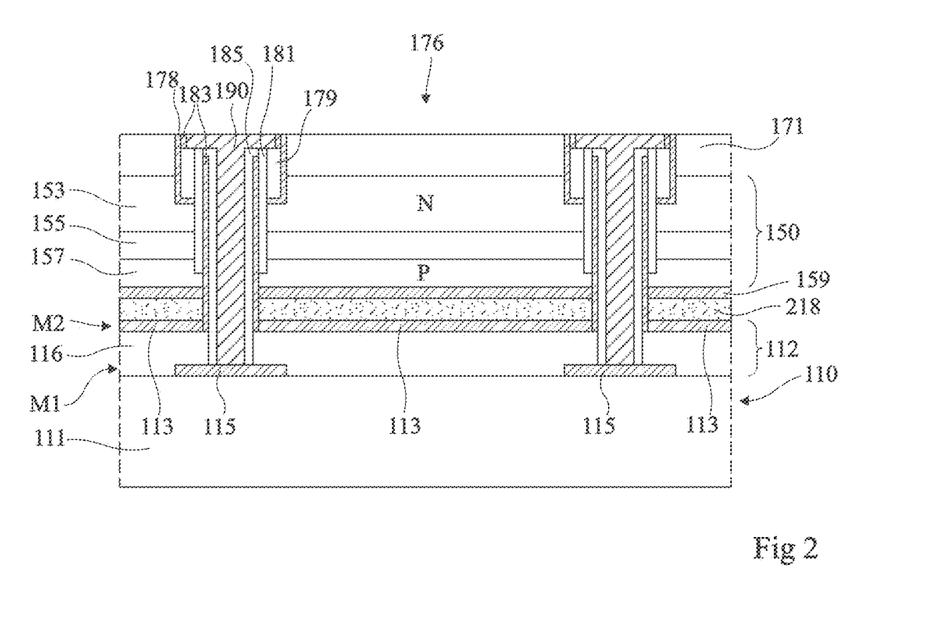
FIG. 2 is a cross-section view illustrating a variation of the method of FIGS. 1A to 1O.

FIG. 2 is a cross-section view illustrating a variation of the method of FIGS. 1A to 1O. In the example of FIG. 2, the bonding of active LED stack 150 to control circuit 110 by direct bonding of insulating layer 161 onto insulating layer 118, such as described in relation with FIG. 1C, is replaced with a bonding by means of a layer 218 of an electrically-insulating bonding material, for example, an organic glue layer, for example, a silicone layer or a polyimide layer. In the shown example, glue layer 218 has an upper surface in contact with the lower surface of the metal anode contacting layer 159, and a lower surface in contact with the upper surface of control circuit 110. Glue layer 218 is for example deposited on the upper surface of control circuit 110, or on the lower surface (in the orientation of FIG. 1C) of active LED stack 150, or partly on the upper surface of control circuit 110 and partly on the lower surface of active LED stack 150 and partly on the lower surface of active LED stack 150, before the transfer of active LED stack 150 onto control circuit 110. The other steps of the method are for example identical or similar to what has been described in relation with FIGS. 1A to 1O.

An advantage of the alternative embodiment of FIG. 2 is that the bonding of active LED stack 150 to control circuit 110 is simpler to implement than the direct insulator-to-insulator bonding described in relation with FIG. 1C.

Specific embodiments have been described. Various alterations and modifications will occur to those skilled in the art. In particular, the conductivity types of gallium nitride layers 153 (of type N in the described examples) and 157 (of P type in the described examples) may be inverted.

Further, although only embodiments of display devices based on gallium nitride LEDs have been described, the described embodiments may be adapted to the manufacturing of a sensor comprising a plurality of gallium nitride photodiodes individually addressable to acquire an image.

More generally, the described embodiments may be adapted to the manufacturing of any display device or photosensitive sensor based on semiconductor diodes, including made up of semiconductor materials other than gallium nitride, for example, diodes made up of other III-V semiconductor materials or diodes made up of silicon.

Further, in the described examples, the provision of a metal layer 159 on top of and in contact with the upper surface (in the orientation of FIG. 1B) of anode layer 157 of active diode stack 150 enables to minimize the cathode contact resistance, and thus to limit the electric power consumption of the device. As a variation, metal layer 159 may however be omitted, the cathode contact being then only taken, in each diode, on the sides of cathode region 157, via peripheral metallization 183 coupling the sides of cathode region 157 to a metal connection pad 113 of control circuit 110.

Further, the described embodiments are not limited to the examples described hereabove where cathode contact metallization 190 is electrically connected to control circuit 110 within the pixel array (via metal connection regions 115). As a variation, cathode contact metallization 190 may be connected to control circuit 110 only at the periphery of the pixel array, via one or a plurality of peripheral connection pads of control circuit 110.

Such alterations, modifications, and improvements are intended to be part of this disclosure, and are intended to be within the spirit and the scope of the present invention. Accordingly, the foregoing description is by way of example only and is not intended to be limiting. The present invention is limited only as in the following claims and the equivalents thereto.

The invention claimed is:

1. A method of manufacturing an optoelectronic device, comprising the steps of:
a) transferring, onto a connection surface of a control circuit, an active diode stack comprising at least first and second doped semiconductor layers of opposite conductivity types, so that the second semiconductor layer of the stack faces the connection surface of the control circuit and is separated from the connection surface of the control circuit by at least one electrically-insulating layer, said at least one insulating layer and said active diode stack extending over the entire surface of the control circuit;
b) forming in the active stack trenches delimiting a plurality of diodes, the trenches further extending through said at least one insulating layer and emerging onto the connection surface of the control circuit;
c) forming in said trenches first metallizations connecting the second semiconductor layer of the stack to the connection surface of the control circuit;
further comprising forming, in said trenches, of second metallizations insulated from the first metallizations, in contact with the sides of the first semiconductor layer;
further comprising, successively
a first step of partial forming of the trenches all the way to an intermediate level of the first semiconductor layer;
a step of deposition of a first metal layer on the lateral walls of the trenches;
a step of forming of first spacers made of an insulating material on the lateral walls of the trenches;
a step of extension of the trenches all the way to an intermediate level of the second semiconductor layer;
a step of forming of second spacers made of an insulating material on the lateral walls of the trenches;
a step of extension of the trenches all the way to the connection surface of the control circuit; and
a step of deposition of a second metal layer on the lateral walls of the trenches,
wherein the first metallizations are formed in the second metal layer and the second metallizations are formed in the first metal layer.

2. The method of claim 1, wherein, at step a), the active diode stack is bonded to the control circuit by means of a layer made of an electrically-insulating bonding material forming said at least one insulating layer.

3. The method of claim 2, wherein the electrically-insulating bonding material is an organic glue.

4. The method of claim 1, further comprising, before step a), a step of deposition of a metal layer on top of and in contact with the entire surface of the second semiconductor layer of the active stack.

5. The method of claim 1, wherein, during the implementation of step a), the active stack is supported by a support substrate located on the side of the first semiconductor layer opposite to the second semiconductor layer, the method further comprising, between step a) and step b), a step of removing the support substrate.

6. The method of claim 1, wherein said semiconductor diodes are light-emitting diodes.

7. The method of claim 1, wherein said diodes are photodiodes.

8. The method of claim 1, wherein the first and second semiconductor layers are gallium nitride layers, said diodes being gallium nitride diodes.

9. The method of claim 1, wherein the control circuit is formed inside and on top of a semiconductor substrate.

10. A method of manufacturing an optoelectronic device, comprising the steps of:
a) transferring, onto a connection surface of a control circuit, an active diode stack comprising at least first and second doped semiconductor layers of opposite conductivity types, so that the second semiconductor layer of the stack faces the connection surface of the control circuit and is separated from the connection surface of the control circuit by at least one electrically-insulating layer, said at least one insulating layer and said active diode stack extending over the entire surface of the control circuit; and b) forming in the active stack trenches delimiting a plurality of diodes, the trenches further extending through said at least one insulating layer and emerging onto the connection surface of the control circuit; and c) forming in said trenches first metallizations connecting the second semiconductor layer of the stack to the connection surface of the control circuit;

further comprising, before step a):

a step of deposition of a first insulating layer over the entire connection surface of the control circuit; and a step of deposition of a second insulating layer over the entire surface of the second semiconductor layer of the active diode stack, and wherein, at step a), the active diode stack is bonded to the control circuit by direct bonding of the first insulating layer to the second insulating layer, said at least one electrically-insulating layer being formed by the stacking of the first and second insulating layers.

11. The method of claim 2, wherein the first and second insulating layers are made of silicon oxide.

* * * * *

UNITED STATES PATENT AND TRADEMARK OFFICE
CERTIFICATE OF CORRECTION

| | | |
|---|---|---|
| PATENT NO. | : 11,444,118 B2 | |
| APPLICATION NO. | : 16/568392 | |
| DATED | : September 13, 2022 | |
| INVENTOR(S) | : Hubert Bono et al. | |

It is certified that error appears in the above-identified patent and that said Letters Patent is hereby corrected as shown below:

In the Claims

At Column 13, Claim 11, Line 26, delete "2" and replace with –10–

Signed and Sealed this
Twenty-ninth Day of November, 2022

Katherine Kelly Vidal
*Director of the United States Patent and Trademark Office*